(12) United States Patent
Worledge

(10) Patent No.: US 6,943,571 B2
(45) Date of Patent: Sep. 13, 2005

(54) REDUCTION OF POSITIONAL ERRORS IN A FOUR POINT PROBE RESISTANCE MEASUREMENT

(75) Inventor: Daniel Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 10/391,062

(22) Filed: Mar. 18, 2003

(65) Prior Publication Data

US 2004/0183554 A1 Sep. 23, 2004

(51) Int. Cl.[7] .......................... G01R 31/26; G01R 27/08
(52) U.S. Cl. ....................................... 324/719; 324/715
(58) Field of Search ................................. 324/719, 724, 324/525, 527, 537, 754, 765, 758, 691

(56) References Cited

U.S. PATENT DOCUMENTS 4,703,252 A * 10/1987 Perloff et al. ............... 324/758
5,691,648 A * 11/1997 Cheng ........................ 324/716
6,747,445 B2 * 6/2004 Fetterman et al. .......... 324/71.1

* cited by examiner

*Primary Examiner*—Anjan Deb
*Assistant Examiner*—Amy He
(74) *Attorney, Agent, or Firm*—Michael J. Buchenhorner; Wan Yee Cheung

(57) ABSTRACT

A system and method for measuring a resistance or a resistance per square, $R_{sq}$, of a material having a surface using a multi-point probe including four or more collinear contact points placed in the interior of the sample, the method including: making a first measurement using a first set of probe electrodes for inducing a current and a second set of probe electrodes for measuring the voltage difference when the current is induced; making a second measurement using a set of probe electrodes different from the first set for inducing a current and a set of probe electrodes different from the second set for measuring the voltage difference when the current is induced; and using a known relationship among the currents induced, the voltages measured, the nominal probe positions and the resistance per square to determine the resistance per square such that measurement errors resulting from positioning of the probes are reduced.

6 Claims, 6 Drawing Sheets

REDUCTION OF POSITIONAL ERRORS IN A FOUR POINT PROBE RESISTANCE MEASUREMENT

FIELD OF THE INVENTION

The invention disclosed broadly relates to the field of resistance measurement probes and more specifically to four point probes for resistance measurements in semiconductor wafers.

BACKGROUND OF THE INVENTION

Probes for measuring resistivity in sheets and wafers are known in the art. One example of such probes is the four-point probe as shown in FIG. 1. The purpose of a 4-point probe is to measure the resistivity of a semiconductor material. It can measure either bulk or thin film specimens.

Referring to FIG. 1, there is shown a four-point resistivity probe 100. The probe 100 comprises four electrodes 110, 120, 130, and 140 for probing a wafer 150. In this example consider each of the electrodes to be equally spaced. The probe is placed in the interior of the sample, and the probes are collinear. Generally, the probe 100 works by applying a known level of current, I, between electrodes 110 and 140 via the wafer 150. Then the voltage, V, between electrodes 120 and 130 is measured. The resistance of the part of the wafer 150 being measured is determined using Ohm's law and the measured voltage V. Thus, V is divided by I to produce the sought resistance measurement. In this example, the polarity of current I or the voltage V could be the reverse of what is shown. In this case electrode 140 is a current source and electrode 110 collects the current while the voltage difference across electrodes 130 and 120 is measured. The current represented by arrow 160 actually flows throughout various paths in the wafer 150, defining a resistance network. The current 160 creates an electric field to be measured using a voltage meter. The resistance per square ($R_\square$) also referred to as "$R_{sq}$" is derived from these measurements according to well known relationships between the measured parameters. In the prior art it was known to make measurements using combinations of probes other than the one discussed but only one such combination was used to derive the resistance per square for a wafer. In the prior art more than one combination of probes was used when the probes were placed on the perimeter of the sample. Here we restrict ourselves to cases where the probes are placed in the interior of the sample.

As used herein, a "probe" is a device that is not affixed to the surface being measured. A probe can be affixed to an intermediate metal structure, such as a contact pad. Electric coupling of the probe to the tunnel junction film stack can occur through physical contact between the probe and the surface of the tunnel junction film stack, through a probe that is affixed to an intermediate metal structure, or through other techniques known to those skilled in the art.

Referring again to FIG. 1 there is shown an example of a device some researchers have used to measure resistance of tunnel junction films. A portion of a semiconductor wafer 150 to be measured is shown. The wafer 150 comprises a substrate 152 and an unprocessed stack 151 having a number of tunnel junction films. The tunnel junction films comprise the top layer 158, tunnel barrier 156, and bottom layer 154. The four-point probe 100 comprising probes 110, 120, 130, and 140, each separated by a distance, a, so that the entire distance from start to end of the four-point probe 100 is L.

Each probe 110 through 140 contacts the top surface 162 of top layer 158. Probe 110 is used to inject current I, and probe 140 is used to collect the current after it passes through the unprocessed stack 151. Probes 120 and 130 are used to measure voltage V.

The four-point probe 100 is a well known tool used to characterize many different types of semiconductors and other materials. In fact, it is used to characterize Giant Magneto Resistive (GMR) films, which are used in read and write heads of many current hard drives. In GMR, the tunnel barrier 156 is replaced by a metal, which allows current to flow to the pinned layer 154. The four point probe 100 is also commonly used to measure the resistance of a blanket film. In this case the unprocessed stack 151 is composed of one or more conducting layers.

The resistance per square ($R_\square$), of the material of the wafer 150, is defined by the relationship $R_\square = \rho/t$, where $\rho$ is the resistivity and t is the thickness of the material (wafer 150). Resistivity is a property of the material.

The method for measuring resistance or resistivity of wafer materials used by the apparatus of FIG. 1 works well for many purposes; however errors can occur in the resistivity measurements caused by the position of the probe points on the subject wafer or sheet.

Van der Pauw, "A Method for Measuring the Resistivity and Hall Coefficient on Lamellae of Arbitrary Shape," 20 Philips Technical Review page 220 (1958), discussed a resistivity measurement of a flat lamella with four small contacts at arbitrary places on the periphery. However, the techniques discussed in that article only apply to measurements made on the periphery of the lamella measured Therefore, there is a need for a resistance measurement system that overcomes these drawbacks in the known art.

SUMMARY OF THE INVENTION

A system for measuring resistance per square on a surface of a material comprises a probe comprising first, second, third and fourth electrodes; a current source for inducing a current from a selected electrode to a second selected electrode; a voltage meter for measuring a voltage difference between a pair of selected electrodes; and a multiplexer comprising a plurality of output lines connected to the probe and a plurality of input connections, at least two of which are connected to the current source and at least another two of which are connected to the voltage meter; and a controller coupled to the multiplexer. The controller comprises logic for making a first measurement using a first set of probe electrodes for inducing a current and a second set of probe electrodes for measuring the voltage difference when the current is induced; making a second measurement each using a set of probe electrodes different from the first set for inducing a current and a set of probe electrodes different from the second set for measuring the voltage difference when the current is induced; and using a known relationship among: the currents induced; the voltages measured; the nominal probe positions; and the resistance per square to determine the resistance per square such that measurement errors resulting from positioning of the probes are reduced.

According to other aspects of the invention, a method using a system as described above comprises steps for performing the functions of the logic of the controller and a computer-readable medium comprises program instructions for causing a programmable processor to perform the functionality of the logic described above.

DESCRIPTION OF THE PREFERRED EMBODIMENT

Figure 1:
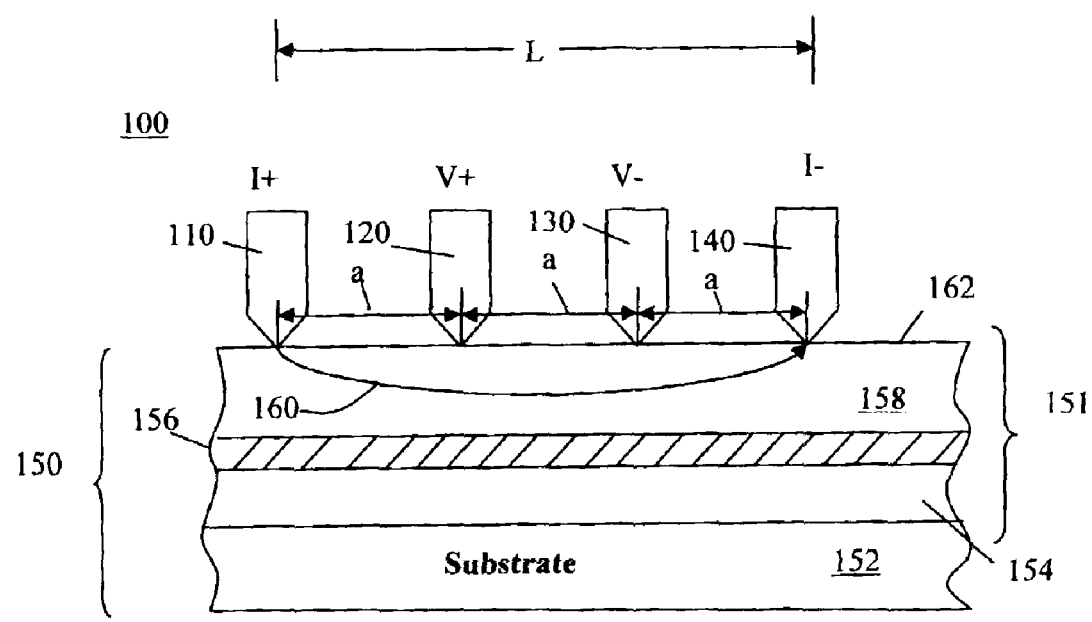
FIG. 1 is an illustration of a four-point resistivity measurement probe according to the prior art.

According to an embodiment of the invention, a method for measuring a resistance per square, $R_\square$, of a material (e.g., a semiconductor wafer) uses a four-point probe such as the one depicted in FIG. 1 for making a plurality of resistance measurements we shall call A, B, and G to eliminate errors due to the positions of the probe points. The method implements an algorithm comprising making two or more measurements, each using a different combination of probe electrodes and then using a known relationship to determine a resistance per square that eliminates measurement errors resulting from positioning of the probes.

Figure 2:
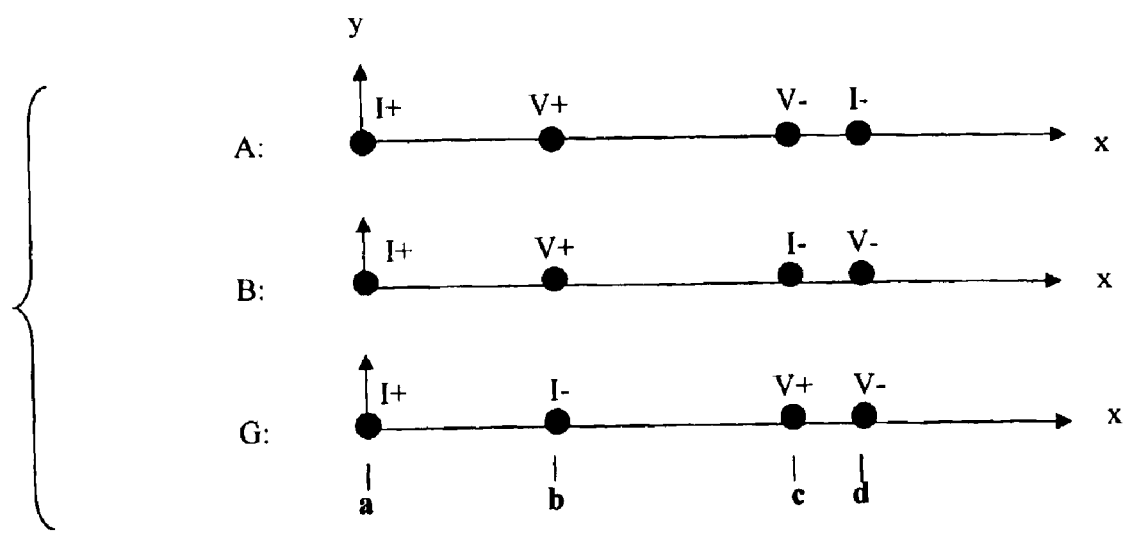
FIG. 2 shows a set of probe points, with three different electrical configurations, on the surface of a material whose resistivity is to be measured using a method according to the invention.

The resistivity measurement commences by bringing the contact points (such as those shown in FIG. 1 and identified with numerals 110–140) into contact with a surface of a wafer or sheet material 150 to be measured. FIG. 2 shows a series of resistance measurements A, B, and G made on a set of four points a, b, c, and d that are located in the interior of the material along a horizontal axis, x. The points a, b, c, and d are substantially collinear and have coordinates (0,0), (x,0), (y,0), and (z,0), respectively. The letters x, y, and z are used to represent values along the x axis, where x>0, y>x, and z>y. FIG. 2 also shows a different permutation of applying voltage and current on different points for each measurement, A, B, and G. As discussed herein points are considered in the interior of material 101 if they are at a distance from the periphery that is greater than the distance between the two closest probe points.

Referring again to FIG. 2, the four point resistance measurement 200 is done with the probe points in a line (i.e., substantially collinear), but not necessarily equally spaced. As used herein, "substantially collinear" means that the probe points define as close to a straight line as the tolerance of current standard measurements will allow. There are six permutations of current and voltage probes (not including trivial changes of sign). However, because interchanging current and voltage probes yield the same resistance, there are only three independent measurements. In addition, G=B−A, leaving only two independent measurements (A and B). We define a new function wherein the resistance is R=A−αB where α is a number. Then we have the following theorem. For all probe spacings there exists a number α such that R is independent of positional errors in both the x and y directions, to first order. This theorem is proved as follows. First note that positional errors in y only change the distances between the probes to second order, so we only have to worry about errors in the x direction. Without loss of generality, place the first probe at the origin (this just means that errors in the first probe come about through simultaneous errors of equal size and direction in the other three probes), and use the coordinates shown in FIG. 2.

Then R=R(x,y,z) and we want to show that, to first order:

$$\Delta R = \frac{\partial R}{\partial x}\Delta x + \frac{\partial R}{\partial y}\Delta y + \frac{\partial R}{\partial z}\Delta z = 0,$$

for all $\Delta x$, $\Delta y$, $\Delta z$. This means that we must show that:

$$\frac{\partial R}{\partial x} = \frac{\partial R}{\partial y} = \frac{\partial R}{\partial z} = 0 \text{ or that } \alpha = \frac{\frac{\partial A}{\partial x}}{\frac{\partial B}{\partial x}} = \frac{\frac{\partial A}{\partial y}}{\frac{\partial B}{\partial y}} = \frac{\frac{\partial A}{\partial z}}{\frac{\partial B}{\partial z}}.$$

Since $A = \frac{R_\square}{2\pi}\ln\left[\frac{y(z-x)}{x(z-y)}\right]$ and $B = \frac{R_\square}{2\pi}\ln\left[\frac{z(y-x)}{x(z-y)}\right]$, then $$\alpha = \frac{\frac{\partial A}{\partial x}}{\frac{\partial B}{\partial x}} = \frac{\frac{\partial A}{\partial y}}{\frac{\partial B}{\partial y}} = \frac{\frac{\partial A}{\partial z}}{\frac{\partial B}{\partial z}} = \left[\frac{z(y-x)}{y(z-x)}\right].$$

That proves the theorem.

As a simple example of how to use the theorem, consider determining $R_{SQ}$ with a probe having equally-spaced electrodes such as 110–140. In this case, α=3/4, and in the absence of positional errors, $$A = \frac{R_\square}{2\pi}\ln(4) \text{ and } B = \frac{R_\square}{2\pi}\ln(3).$$

ln(3). In the prior art, one might have measured only A and reported the quantity:

$$R_\square = 2\pi\frac{A}{\ln(4)}.$$

Using the invention, both measurements A and B are made, and the following quantity is reported:

$$R_\square = 2\pi\frac{A - \frac{3}{4}B}{\ln(4) - \frac{3}{4}\ln(3)}.$$

This gives the same mean result as the prior art, but with substantially smaller errors.

Now consider the general case of a resistance probe with unequally spaced probe electrodes (e.g., 110–140 but with different distances between the probe electrodes) and take into account trivial reformulations based on the relationship G=B−A. It should be noted that $$G = \frac{R_\square}{2\pi}\ln\left[\frac{z(y-x)}{y(z-x)}\right]$$

In the prior art, one would have measured only A or B or G and reported $$R_\square = \frac{2\pi}{\ln\left[\frac{y(z-x)}{x(z-y)}\right]}A \text{ or } R_\square = \frac{2\pi}{\ln\left[\frac{z(y-x)}{x(z-y)}\right]}B \text{ or } R_\square = \frac{2\pi}{\ln\left[\frac{z(y-x)}{y(z-x)}\right]}G,$$

respectively.

(There are also trivial changes of sign one can make by reversing the order of the current probes or reversing the order of the voltage probes). According to an embodiment of the invention, one measures both A and B, and reports the quantity:

$$R_\square = 2\pi \frac{A - \alpha\beta}{\ln\left[\frac{y(z-x)}{x(z-y)}\right] - \alpha\ln\left[\frac{z(y-x)}{x(z-y)}\right]}.$$

Alternatively, one measures both A and G, and reports the quantity:

$$R_\square = 2\pi \frac{A - \alpha(A+G)}{\ln\left[\frac{y(z-x)}{x(z-y)}\right] - \alpha\ln\left[\frac{z(y-x)}{x(z-y)}\right]}.$$

According to another alternative, one measures both B and G, and reports the quantity:

$$R_\square = 2\pi \frac{(B-G) - \alpha B}{\ln\left[\frac{y(z-x)}{x(z-y)}\right] - \alpha\ln\left[\frac{z(y-x)}{x(z-y)}\right]}.$$

Note that because G=B−A, these are all the same.

Figure 3:
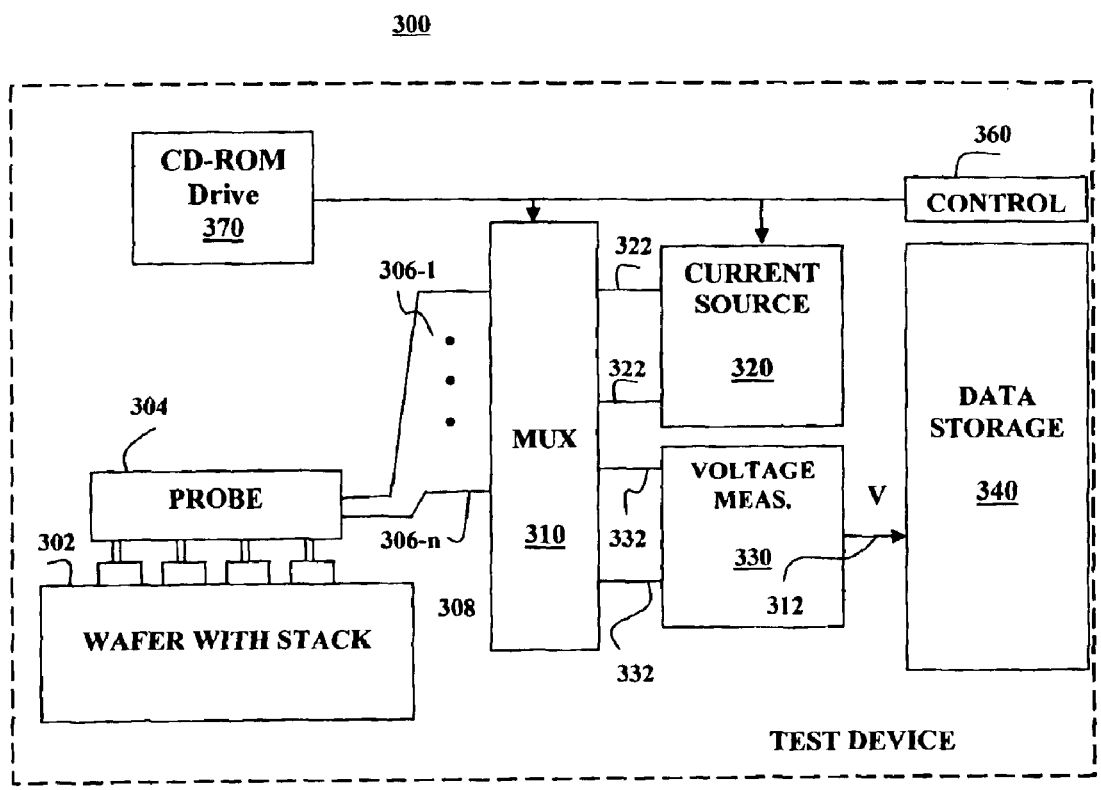
FIG. 3 is a schematic representing an entire resistivity test system according to an embodiment of the invention.

FIG. 3 shows a schematic representing an entire resistivity test system 300 according to an embodiment of the invention. The object to be tested is a wafer which could just have a blanket film on it or it could be a wafer with stack 302 that has a structure substantially similar to that shown in FIG. 1. The probe 304 comprises four electrodes that are the same as or substantially similar to electrodes 110–140 shown in FIG. 1. The probe 304 is connected to a multiplexer 310 having a plurality of outputs 306-1 through 306-n. The multiplexer 310 is used to control the electrodes used for inducing a current and those used for measuring a voltage. Thus, a current source 320 is connected to the multiplexer 310 by means of two connection lines 322 and a voltage measurement device 330 is connected to the multiplexer 310 by means of two connection lines 332. As different probe electrode configurations are desired the multiplexer 310 provides different connections to the probe 304.

The voltage measurement device 330 is connected to a data storage device 340 for storing the voltage measurements made. A control device 360 (e.g., a microprocessor with memory for instructions) is connected to the multiplexer 310 by a bus 350. A removable CD-ROM drive 370 is also connected to the control device 360 by the bus 350.

The control device 360 comprises logic for running a method according to the invention. The logic can take the form of program logic stored in a computer-readable medium such as a CDROM and that can be stored in the control device 360 for execution by its processor. It is also possible to implement the control device as an application-specific integrated circuit (ASIC) having the same functionality.

Figure 4:
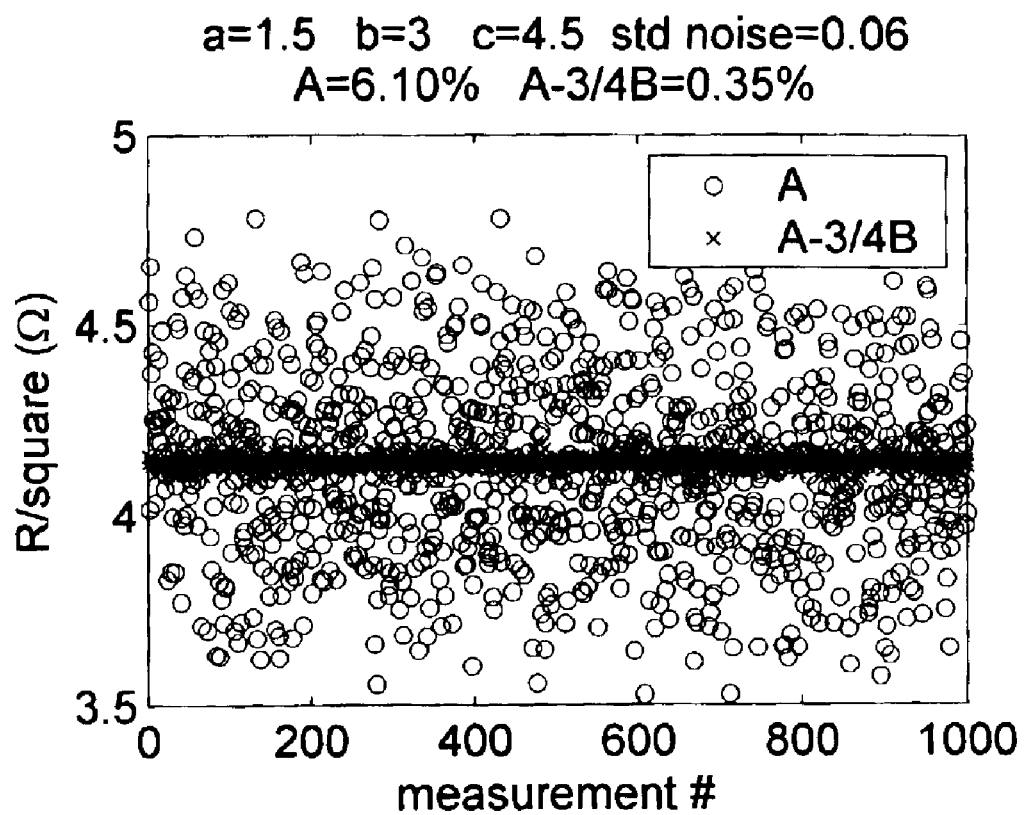
FIG. 4 is a graph showing numerical simulations of the reduction in percent error when measurements according to an embodiment of the invention are made.

Referring to FIG. 4, a graph shows that the reduction in the percent error using a method according to the invention is numerically simulated to be more than a factor of seventeen. The data shown in FIG. 4 was simulated using probe electrodes that are 1.5 microns apart with random positional errors in both the x and y directions on all probes simultaneously. The errors are normally distributed with a standard deviation of 60 nm. The standard deviation using the prior art is numerically simulated to be 6.10% of the mean and the standard deviation using this invention is numerically simulated to be 0.35% of the mean. The figure shows measurements of A as circles and measurements of A−3/4 B as xs (bunched together to form a thick line across the graph).

Figure 5:
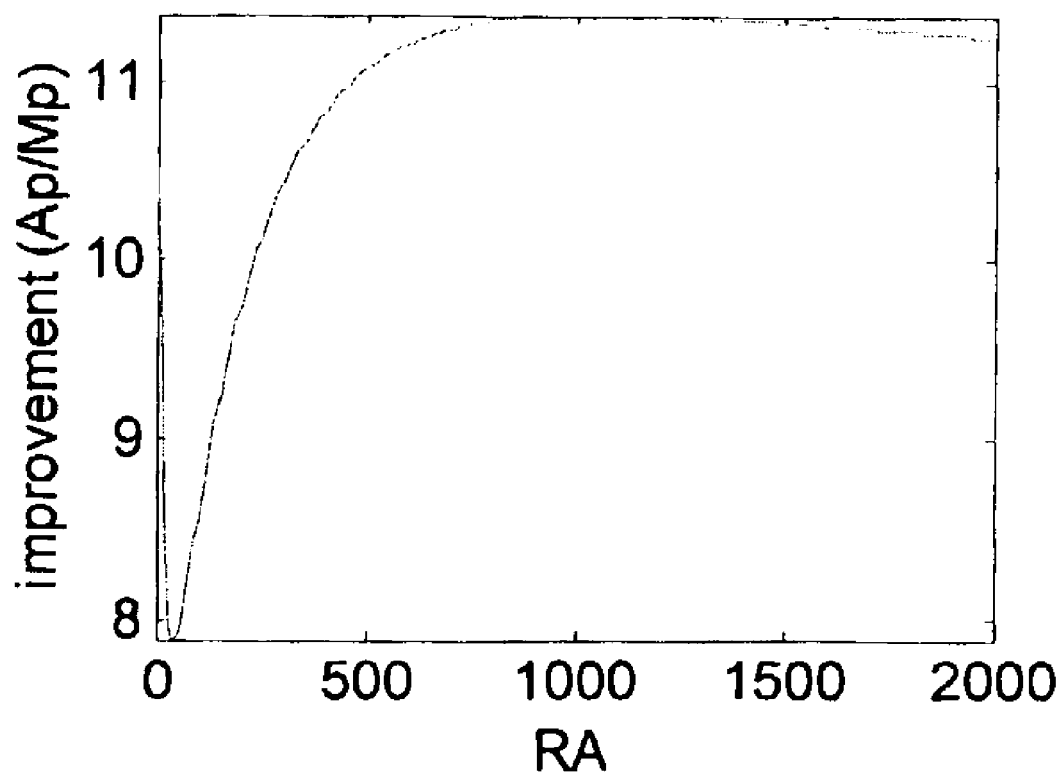
FIG. 5 is a graph showing the usefulness of methods according to the invention in cases where RA is not zero.

Referring to FIG. 5 a graph shows that a method according to the invention is still useful for the current in plane tunneling (CIPT) case (i.e., where RA is not zero). RA is the resistance-area product of a tunnel junction stack. A slightly different weight, alpha, is used to compensate for the non-zero RA. The error is now reduced by a factor of 8–11, depending on the RA.

Figure 6:
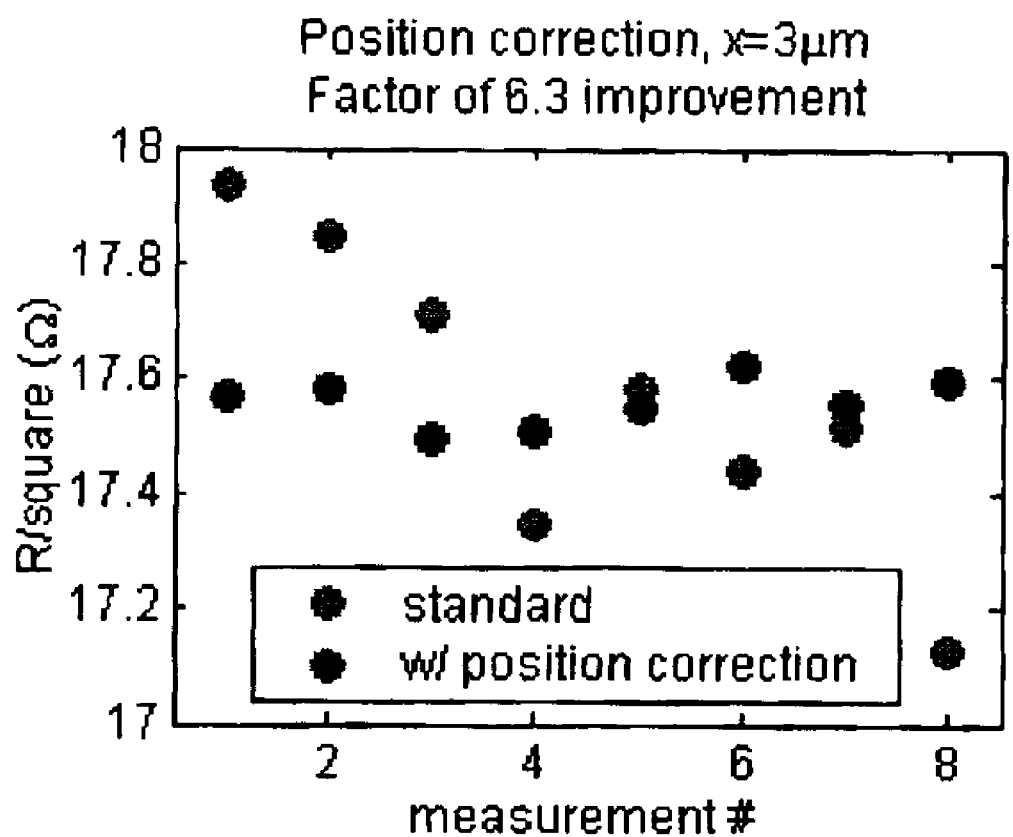
FIG. 6 shows experimental data for an approximately equally-spaced probe using a spacing of three microns on a tunnel junction sample with RA~1000 Ohm-micron$^2$.

FIG. 6 shows experimental data for a roughly equally spaced probe with electrode spacing of 3 microns, on a tunnel junction sample with RA~1000 Ohm-micron². This provides a factor of 6.3 improvement over the prior art technique.

Therefore, while there has been described what is presently considered to be the preferred embodiment, it will be understood by those skilled in the art that other modifications can be made within the spirit of the invention.

I claim:

1. A method for measuring a resistance, R, of a material having a surface using a multi-point probe comprising four or more substantially collinear contact points, the method comprising:

making a first measurement using a first set of probe electrodes for inducing a current and a second set of probe electrodes for measuring a first voltage difference when the current is induced;

making a second measurement using a set of probe electrodes different from the first set for inducing a current and a set of probe electrodes different from the second set for measuring a second voltage difference when the current is induced; and using a known relationship among the currents induced, the voltages measured, the nominal probe positions and the resistance per square to determine the resistance per square such that measurement errors resulting from positioning of the probes are reduced;

wherein the multi-point probe comprises contact points a, b, c, and d; wherein the points located along a horizontal axis on the surface at locations (0,0), (x,0), (y,0) and (z,0) respectively, such that x is greater than 0, y is greater than x, and z is greater than y; the resistance measured is resistance per square, and wherein the method comprises:

inducing a current between points a and d;

measuring a voltage difference between point b and point c;

reporting a resistance measurement A;

inducing a current between points a and c;

measuring a voltage difference between point b and point d;

reporting a resistance measurement B; and determining the resistance per square, $R_{sq}$, according to the following relationship, where α is a number such that α=z(y−x)/y(z−x):

$R_{sq}=2\pi(A-\alpha B)/(\ln[y(z-x)/x(z-y)]-\alpha\ln[z(y-x)/x(z-y)])$.

2. The method of claim 1 wherein the measurement is made with the probes in the interior of the material being measured.

3. The method of claim 1 wherein the multi-point probe comprises contact points a, b, c, and d; wherein the points located along a horizontal axis on the surface at locations (0,0), (x,0), (y,0) and (z,0) respectively, such that x is greater than 0, y is greater than x, and z is greater than y; the resistance measured is resistance per square, and wherein the method comprises:

inducing a current between points a and d; measuring a voltage difference between point b and point c;

reporting a resistance measurement A;

inducing a current between points a and b;

measuring a voltage difference between points c and d;

reporting a resistance measurement G; and determining the resistance per square, $R_{sq}$, according to the following relationship, where α is a number such that α=z(y−x)/y(z−x):

$R_{sq}=2\pi(A-\alpha(A+G))/(\ln[y(z-x)/x(z-y)]-\alpha\ln[z(y-x)/x(z-y)])$.

4. The method of claim 1 wherein the multi-point probe comprises contact points a, b, c, and d; wherein the points located along a horizontal axis on the surface at locations (0,0), (x,0), (y,0) and (z,0) respectively, such that x is greater than 0, y is greater than x, and z is greater than y; the resistance measured is resistance per square, and wherein the method comprises:

inducing a current between points a and c;

measuring a voltage difference between point b and point d;

reporting a resistance measurement B;

inducing a current between points a and b;

measuring a voltage difference between points c and point d;

reporting a resistance measurement G; and determining the resistance per square, $R_{sq}$, according to the following relationship, where α is a number such that α=z(y−x)/y(z−x):

$R_{sq}=(2\pi(B-G)-\alpha B)/(\ln[y(z-x)x(z-y)]-\ln[z(y-x)x(z-y)])$.

5. A method for measuring a resistance per square, $R_{sq}$, of a material having a surface using a four-point probe comprising contact points a, b, c, and d, wherein the points are substantially collinear, equally-spaced and are located along a horizontal axis on the surface at locations (0,0), (x,0), (2x,0) and (3x,0) respectively, the method comprising:

inducing a current between points a and d;

measuring a voltage difference between point b and point c;

reporting a resistance measurement A;

inducing a current between points a and c;

measuring a voltage difference between point b and point d;

reporting a resistance measurement B; and determining the resistance, $R_{sq}$, according to the following relationship, where:

$R_{sq}=2\pi(A-3/4B)/(\ln(4)-3/4\ln(3))$.

6. A computer-readable medium comprising program instructions for:

making a first measurement using a first set of probe electrodes for inducing a current and a second set of probe electrodes for measuring the voltage difference when the current is induced, wherein the electrodes are configured for contacting a surface to be probed at substantially collinear points;

making a second measurement using a second set of probe electrodes different from the first set for inducing a current and a set of probe electrodes different from the second set for measuring the voltage difference when the current is induced; and using a known relationship among the currents induced, the voltages measured, the nominal probe positions and the resistance per square to determine the resistance per square such that measurement errors resulting from positioning of the probes are reduced;

inducing a current between points a and d;

measuring a voltage difference between point b and point c;

reporting a resistance measurement A;

inducing a current between points a and c;

measuring a voltage difference between point b and point d;

reporting a resistance measurement B; and determining the resistance, R.sub.sq, according to the following relationship, where α is a number such that α=z(y−x)/y(z−x):$R_{sq}=2\pi(A-\alpha B)/(\ln[y(z-x)/x(z-y)]-\alpha\ln[z(y-x)/x(z-y)])$.

* * * * *